United States Patent [19]

Swisher et al.

[11] 4,330,758
[45] May 18, 1982

[54] SYNCHRONIZED FREQUENCY SYNTHESIZER WITH HIGH SPEED LOCK

[75] Inventors: Scott N. Swisher, Elk Grove; Richard E. Barnett, Palatine, both of Ill.; Paul K. Griner, Maryland Heights, Mo.

[73] Assignee: Motorola, Inc., Schaumburg, Ill.

[21] Appl. No.: 122,929

[22] Filed: Feb. 20, 1980

[51] Int. Cl.³ .............................................. H03L 7/18
[52] U.S. Cl. ..................................... 331/1 A; 331/14; 331/16; 331/17; 331/25
[58] Field of Search ..................... 331/1 A, 10, 14, 16, 331/17, 18, 25, 26, 27, 28

[56] References Cited

U.S. PATENT DOCUMENTS

| | | | |
|---|---|---|---|
| 3,729,688 | 4/1973 | Cerny, Jr. et al. | 331/17 X |
| 3,893,040 | 7/1975 | Harp | 331/14 |
| 4,105,948 | 8/1978 | Wolkstein | 331/14 |
| 4,115,745 | 9/1978 | Egan | 331/17 |
| 4,117,420 | 9/1978 | DeKoninck et al. | 331/17 |
| 4,123,724 | 10/1978 | Das et al. | 331/25 X |
| 4,126,831 | 11/1978 | Cochran | 331/25 X |
| 4,131,862 | 12/1978 | Black et al. | 331/4 |
| 4,205,272 | 5/1980 | Kumagai | 331/1 A X |

OTHER PUBLICATIONS

Berlin, "Phase-Locked Loop With Experiments", E & L Instruments, Inc., Derby, Connecticut, 1978, pp. 3-3, 3-4, 4-1, 4-2.

Primary Examiner—Siegfried H. Grimm
Attorney, Agent, or Firm—James A. Scheer; James W. Gillman

[57] ABSTRACT

An improved frequency synthesizer utilizes a first order loop and sample-and-hold phase detector with optimized gain to obtain very fast frequency locking characteristics. In addition, synchronization of the programming of the loop divider and of the range shifting the voltage controlled oscillator is also utilized. An adaptive loop filter is provided to allow a first order loop to be used for lock acquisition and still maintain excellent noise performance after lock has been obtained.

4 Claims, 6 Drawing Figures

FIG. 2

SYNCHRONIZED FREQUENCY SYNTHESIZER WITH HIGH SPEED LOCK

BACKGROUND OF THE INVENTION

I. Field of the Invention

This invention relates generally to the electronic processing art and, in particular, to an improved low noise frequency synthesizer with high speed locking capability.

II. Description of the Prior Art

Digital frequency synthesizers commonly employ standard phase-lock loop circuitry wherein a voltage controlled oscillator (VCO) signal $F_{VCO}$ is divided by a loop divider. The output of the loop divider is fed back and compared in a phase comparator to a reference frequency signal $F_{REF}$. The phase comparator generates a control signal which is then coupled to the controlled oscillator, thereby providing an output signal from the controlled oscillator which has the desired frequency. The loop divider produces an output signal in response to every Nth input pulse thereby dividing the input frequency by N. The output frequency of the VCO will therefore be locked to N times the reference frequency (i.e. $F_{VCO} = N \times F_{REF}$).

One type of phase comparator which can be used is a sample-and-hold phase comparator. This type of phase comparator samples the phase relationship between the input reference frequency and the loop divider output and holds a value representative of that phase relationship on its output until the next sampling occurs. The resulting phase detection signal has minimal ripple voltage, but during each cycle of the reference waveform the output is incremented in steps according to the last sample held. This type of circuit offers high performance and is capable of integration on a semiconductor chip.

By utilizing such a sample-and-hold phase comparator and a programmable loop divider a frequency synthesizer can be constructed which is relatively low in cost and covers a wide bandwidth of frequencies. However, such systems are relatively slow in responding to a command to change the output frequency to a desired new frequency value. One method to decrease the time taken to switch to a new frequency is to increase the loop bandwidth of the synthesizer. This, however, results in increased noise and reference feedthru. Other approaches to high speed frequency synthesis include dual loop and mixed loop synthesizers. However, these require complex and expensive circuitry and tend to generate spurious signals.

Accordingly, there is a need for a frequency synthesizer which is relatively low in cost and which has the capability of very rapidly responding to a command to change its output frequency while maintaining optimum noise and spurious performance.

SUMMARY OF THE INVENTION

It is an object of this invention to provide a frequency synthesizer which is particularly suited for high frequency radio communications applications.

It is another object of the invention to provide an improved frequency synthesizer which has the capability of very rapidly switching from one frequency value to a new desired frequency.

It is another object of the invention to provide an improved frequency synthesizer which has fast locking capability with excellent noise performance.

It is another object of this invention to provide an improved frequency synthesizer which can cover a wide range of frequencies.

Briefly, in accordance with one embodiment of the invention, an improved frequency synthesizer is provided which is capable of locking on to a new frequency at very high speed. In the frequency synthesizer a reference signal of frequency $F_{REF}$ is generated and applied to a first input of a sample-and-hold phase comparator. In addition, a voltage controlled oscillator is provided for producing an oscillator signal at its output in response to a control signal applied to its controlled input. The voltage controlled oscillator (VCO) has a characteristic gain $K_V$. The VCO signal is applied directly to a programmable divider for frequency dividing the oscillator signal by a divisor N. The divided signal is then applied to a second input of a sample-and-hold phase comparator. The sample-and-hold phase comparator compares the reference signal applied to a first input and the divided signal applied to a second input and generates a control signal at its output which is representative of the phase difference between the two input signals. In order to obtain fast lock when changing to a new frequency, the Applicants have determined that the optimum gain $K_{100}$ of the phase comparator must be approximately $K_{100} = N \times F_{REF}/K_V$. Here $F_{REF}$ is expressed in hertz, $K_V$ is expressed in terms of radians/volt-sec, N is the loop divider division ratio and $K_{100}$ is expressed in volts/radian. The resulting control signal generated by the phase comparator with the required gain is coupled to the signal oscillator.

According to another feature of the invention, the programming of the divider from an old divisor to a new divisor to change the synthesizer frequency is synchronized. To synchronize the divider, the new divisor is loaded so that the divider does not begin counting by the new divisor before the divider has completed the count by the old divisor.

According to still another feature of the invention, the voltage controlled oscillator has a plurality of frequency ranges which are synchronously shifted. Thus, the voltage controlled oscillator is shifted to a new frequency range in response to the divider means having completed the count utilizing the old divisor.

According to still another feature of the invention, a signal processing circuit is coupled from the output of the phase comparator to the input of the voltage controlled oscillator. The signal processing circuit is an adaptive filter which directly connects the phase comparator output to the signal controlled oscillator input in response to a change in the divider N. Thus, when the frequency is changed, the phase comparator is connected directly to the signal controlled oscillator for a period of time to permit the new frequency to be acquired. At all other times the signal from the phase comparator is coupled to the input of a filter which filters the control signal and couples the filtered control signal to the voltage controlled oscillator.

Under ideal conditions the invention as described permits locking to a new frequency within one cycle of the reference waveform. This is the result of the use of optimum gain for the sample-and-hold phase comparator. By using the additional features of the loop divider synchronization and range shift synchronization, a high performance frequency synthesizer is provided which takes full advantage of this fast lock capability. In addition, the use of the adaptive filter provides improved noise performance in the lock condition.

BRIEF DESCRIPTION OF THE DRAWINGS

The features of the present invention which are believed to be novel are set forth with particularity in the appended claims. The invention, together with further objects and advantages thereof, may best be understood by reference to the following description when taken in conjunction with the accompanying drawings.

DESCRIPTION OF THE PREFERRED EMBODIMENT

Figures 1, 4, 5:
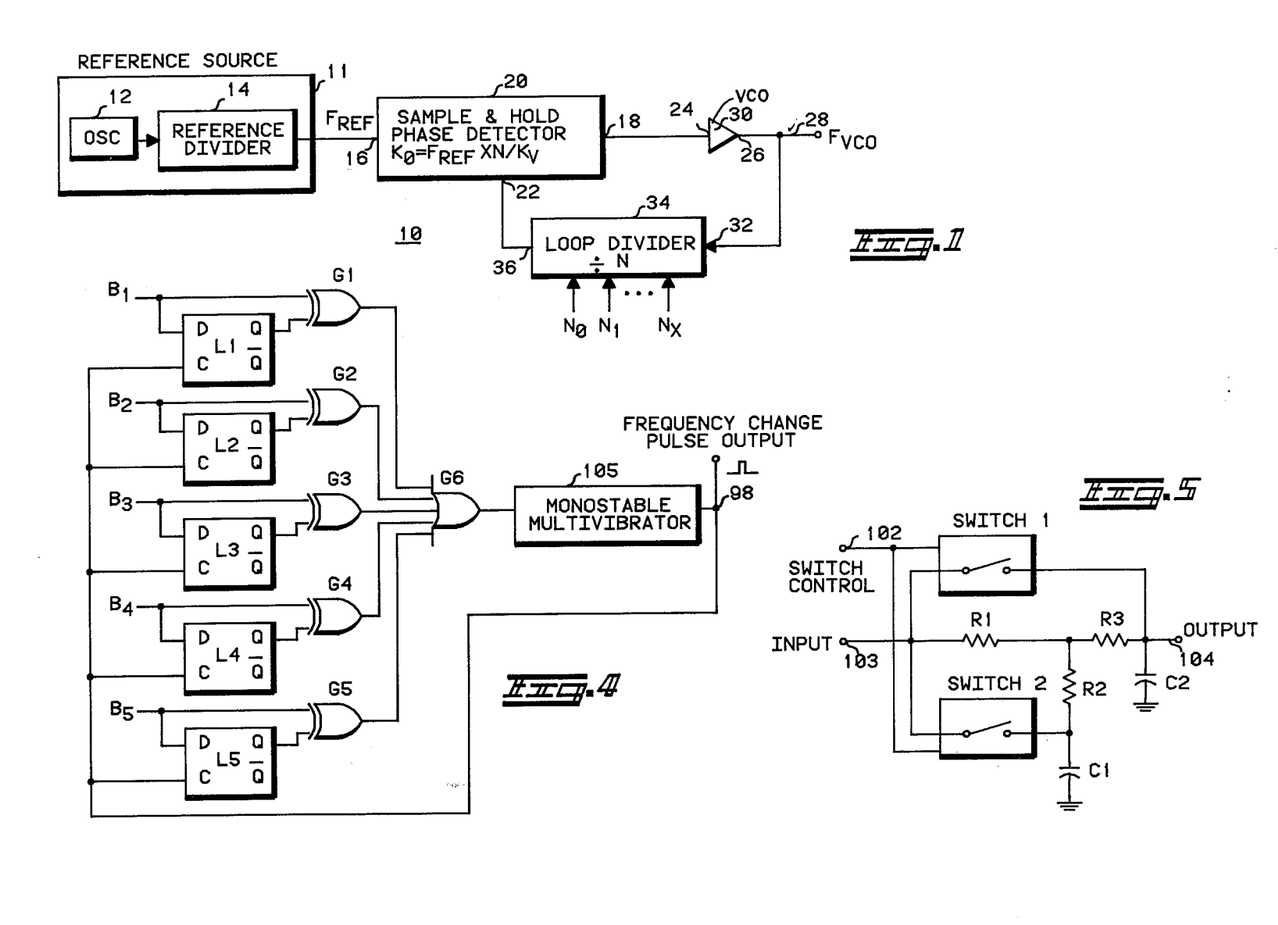
FIG. 1 is a block diagram illustrating one embodiment of the novel fast lock frequency synthesizer utilizing an optimum gain sample-and-hold phase comparator.
FIG. 4 is a schematic diagram illustrating in greater detail the frequency change detector circuit shown in FIG. 3.
FIG. 5 is a schematic diagram illustrating in greater detail the adaptive loop filter shown in FIG. 3.

FIG. 1 is a block diagram illustrating one embodiment of the novel fast lock frequency synthesizer utilizing an optimum gain sample-and-hold phase comparator. As shown therein, a phase-lock loop 10 is utilized having a reference source 11 which produces a reference signal of a frequency $F_{REF}$ such as that shown as waveform A of FIG. 6. In the preferred embodiment, as shown, this reference source 11 is composed of a high frequency oscillator 12 coupled to a reference frequency divider 14 which divides the oscillator frequency to the desired reference frequency $F_{REF}$.

The reference signal is coupled to a first input terminal 16 of an optimum gain sample-and-hold phase comparator 20. The phase comparator 20 has a second input terminal 22 and an output terminal 18. The sample and hold phase comparator 20 compares the reference signal applied to input terminal 16 to a loop divider signal applied to the second input terminal 22. The phase comparator samples the phase relationship between the two signals upon the occurrence of each loop divider pulse and produces a control signal representative of the phase error. This control signal is held on the phase comparator output terminal 18 until the next sampling. Thus, the control signal changes in increments occurring only when a loop divider pulse occurs.

The control signal at the output terminal 18 of the phase comparator 20 is directly coupled to the control input terminal 24 of a voltage controlled oscillator 30. The voltage controlled oscillator 30 produces an oscillator signal of frequency $F_{VCO}$ at its output terminal 26 responsive to a control signal (i.e., the phase comparator error signal) received at the control input terminal 24.

The output terminal 26 of the voltage controlled oscillator 30 feeds to the input terminal 32 of a loop divider 34. The loop divider 34 divides the signal of frequency $F_{VCO}$ from the voltage controlled oscillator by an integer number N. The output terminal 36 of the loop divider 34 is coupled to the second phase comparator input terminal 22 thereby applying to the input terminal 22 a loop divider signal of frequency $F_{VCO}$ divided by N. A typical loop divider signal is shown as waveform L of FIG. 6.

In order to change the frequency at the output terminal 28, the divide ratio N must be changed to a new value. The divide ratio N is changed by reprogramming the loop divider 34 with a new value of N via the inputs $N_O$–$N_X$. The frequency of the signal at the output terminal 28 will be equal to the reference oscillator frequency $F_{REF}$ times the divide ratio N (i.e. $F_{VCO}=F_{REF}\times N$).

Typically, frequency synthesizers of this type are relatively slow in locking to the new frequency when the divide ratio N is changed to a new divide ratio $N_{NEW}$. However, Applicants have determined that, ideally, the synthesizer can lock to the new frequency within one cycle of the reference signal if the gain of the sample-and-hold phase comparator $K_{100}$ is given by the following expression:

$$K_{100}=N\times F_{REF}/K_V, \qquad (1)$$

where $K_{100}$ is expressed in volts/radian, N is the loop divider division ratio, $F_{REF}$ is expressed in hertz, and $K_V$ is the gain of the voltage controlled oscillator expressed in radians/volt-sec. Thus, if the value of N is changed to $N_{NEW}$ after one complete counting of N, a loop pulse will be generated and compared to the reference waveform. If the gain of the phase comparator is the correct value given by equation 1, then the voltage from the phase comparator will be the exact voltage required to shift the VCO to exactly the new desired frequency $F_{REF}\times N_{NEW}$. Thus, the new frequency would be obtainable within one period of the reference waveform. This ideal result cannot actually be obtained due in practice to non-ideal effects such as, non-linearity of the frequency versus voltage characteristics of the voltage controlled oscillator and loop time delays. However, optimum results can be obtained, producing a lock condition within only a few reference waveform periods, by utilizing a sample-and-hold phase comparator gain which is approximately that determined by the equation (1). Therefore, in the preferred embodiment the phase comparator gain is set to be a value approximately that determined by the equation 1.

It is common in the frequency synthesizer art to use a loop divider composed of a dual modulus prescaler and at least two counters in order to obtain division by N. In circuits of this type the divisor N is determined by the count values programmed into the counters. One such system is disclosed in a patent to Miller et al., U.S. Pat. No. 4,053,739, assigned to Motorola, Inc. Another approach, preferred by the Applicants, utilizes a dual modulus prescaler and two counters with programmable modulus A and B. A count cycle begins with the A modulus counter counting while the prescaler has a predetermined modulus of P+1 and when the A count is finished the modulus of the prescaler is changed to a second predetermined modulus P and the B modulus counter begins to count. A complete count cycle ends when the B counter stops counting, and then the cycle begins over again. The operation of the divider is such that when the A modulus counter is counting, the B modulus counter is loading count data, and when the B modulus counter is counting, the A modulus counter is loading count data. Since the A counter is in the counting mode at the beginning of each cycle and the B counters are loading at the same time, then if the divider programming data is changed during this time, the A modulus counter will have counted using the modulus for the old frequency and the B modulus counter will then count using the modulus for the new frequency. Thus, the division ratio will be in error for one cycle and the next sample will not produce the desired loop switching effect.

There are other known prescaler counting systems using multiple counters for the N divide function. In any of these approaches, if the new divide ratio data is loaded at the wrong time during the count cycle, the result is an erroneous divide ratio, which causes the output frequency of the frequency synthesizer to start locking to the wrong frequency. It is therefore desirable to synchronize the programming of the loop divider so as to avoid an erroneous divisor.

Figure 2:
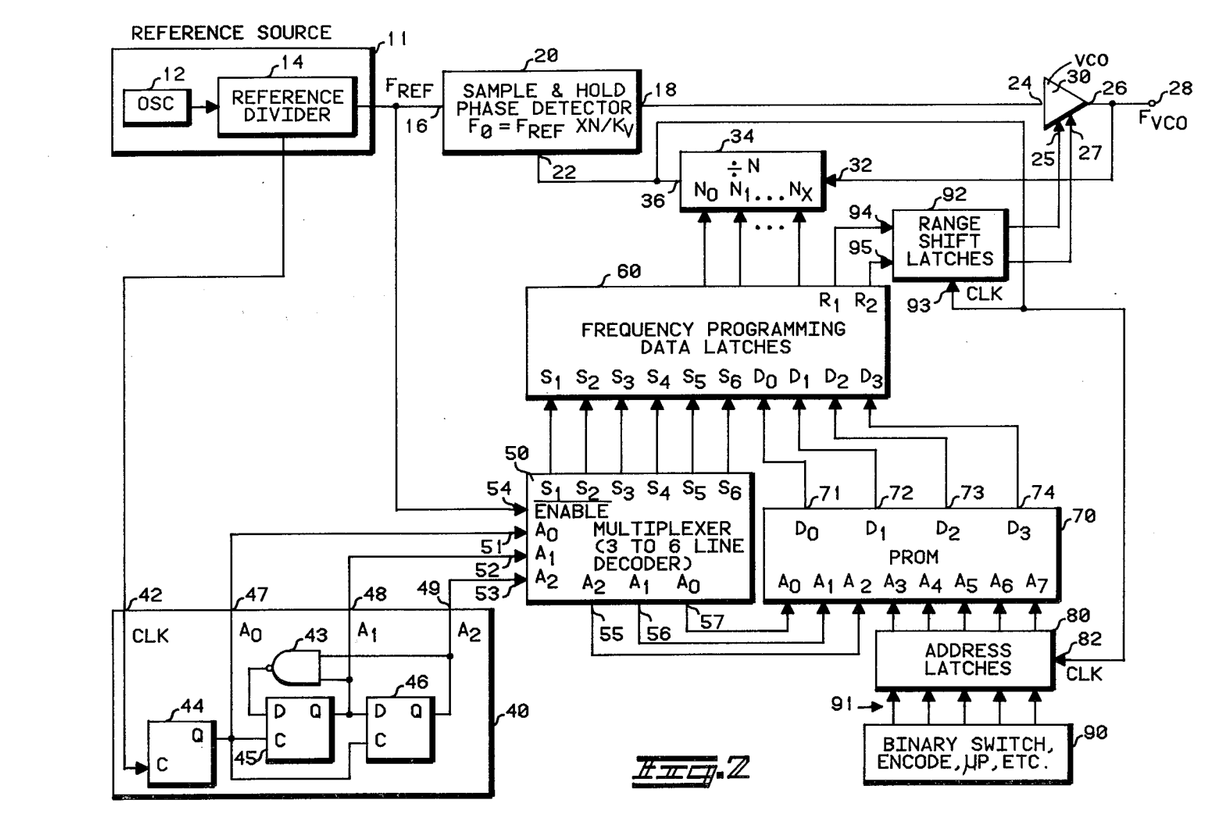
FIG. 2 is a block diagram illustrating another embodiment of the novel fast lock frequency synthesizer utilizing synchronization of the loop divider and the voltage controlled oscillator.

In addition, it is common to use multiplexing to load the new divide data into the loop divider. When this occurs, the time necessary to load these data is spread over a period of time and can result in part of the data being loaded in during one count cycle and part during the next. This also results in erroneous division thereby causing the synthesizer to require more time to lock to its new frequency. FIG. 2 illustrates another embodiment of the invention in which the loading of the loop divider is synchronized in order to take maximum advantage of the optimum gain sample-and-hold frequency synthesizer and avoid delay in lock acquisition due to an erroneous divisor.

Figure 6:
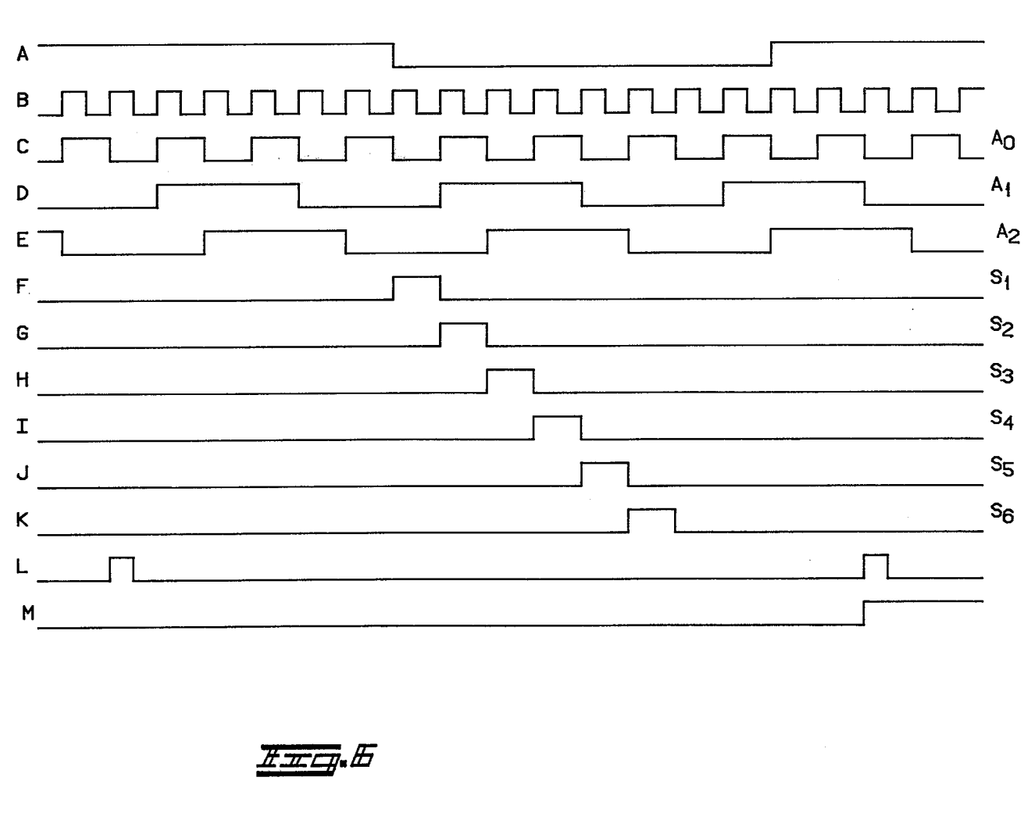
FIG. 6 is a timing diagram illustrating waveforms at various points in the circuits shown in FIGS. 1–5.

In the frequency synthesizer of FIG. 2, a clock signal is taken off an early stage of the reference divider and applied to the CLK input 42 of a counter 40. An example of such a signal is shown as waveform B of FIG. 6. The counter 40 is made up of three flip-flops 44, 45, and 46 and a NAND gate 43 to give a counter of modulus six. The counter 40 as shown will generate six output states, for use as address signals, on its outputs 47, 48 and 49 according to the truth Table 1 shown below, and as shown in FIG. 6 as waveforms C, D and E.

TABLE 1

| OUTPUT STATE | OUTPUT 47 | TERMINAL 48 | 49 |
|---|---|---|---|
| 1 | 0 | 0 | 0 |
| 2 | 1 | 1 | 0 |
| 3 | 0 | 1 | 1 |
| 4 | 1 | 1 | 1 |
| 5 | 0 | 0 | 1 |
| 6 | 1 | 0 | 0 |

The six output states generated by counter 40 are applied to the address inputs 51, 52 and 53 of multiplexer 50. Multiplexer 50 is essentially a 3 to 6 line decoder which is enabled a by low on the $\overline{\text{ENABLE}}$ input 54. The output of the reference source with frequency $F_{REF}$ (waveform A of FIG. 6) is applied to the $\overline{\text{ENABLE}}$ input 54 of the multiplexer. As a result, the six output states from the counter 40 are continually being applied to the address inputs 51, 52 and 53 of the multiplexer 50 but the multiplexer 50 is only enabled when the reference signal is low. This will result in preventing data from being loaded into the loop divider frequency programming data latches 60 except when the reference signal is low. The reference signal is low only during the second part of the N divider count cycle (i.e., when the B counter is counting) due to the phase relationship of the loop divider signal (waveform L in FIG. 6) and the reference divider signal (waveform A in FIG. 6) when the system is in phase lock. Thus, it is during this period when the new data can properly be loaded into the data latches without producing an erroneous divisor.

When the multiplexer 50 is enabled by a low on the $\overline{\text{ENABLE}}$ input 54, the multiplexer 50 applies the address signals (waveforms C, D and E of FIG. 6) to its address outputs 55, 56 and 57 which are coupled directly to the address inputs A0, A1 and A2 of a programmable read-only memory (PROM) 70. Simultaneously, the multiplexer decodes the address inputs on inputs 51, 52, and 53 and sequentially generates a strobe pulse on each of the strobe lines $S_1$–$S_6$. These strobe pulses are shown as waveforms F-K in FIG. 6.

The frequency programming data latches 60 hold the frequency data for the loop divider 34 and can, as well, hold additional information. In the preferred embodiment, this set of latches is made up of a total of 24 latches organized in six groups of four. Each group of four latches is addressed respectively by one of the strobe lines $S_1$–$S_6$. When a pulse appears on the strobe line, data on data input lines $D_0$–$D_3$ of the data latches 60 will be loaded into the strobed latches. The data contained in the latches 60 is applied directly to the loop divider via the inputs $N_0$–$N_X$.

The data applied to the data inputs $D_0$–$D_3$ of data latches 60 is coupled from the data outputs 71, 72, 73, 74 of the PROM 70. The data from the PROM 70 which is applied to these four data outputs 71–74 is determined by the signals on the PROM 70 address inputs $A_0$–$A_7$ from the multiplexer 50 and the address latches 80.

A frequency selection input is applied to the address latches 80 via the five data lines 91 from a frequency selection device 90. The frequency selection device 90 can be any circuit which will supply the five digital address inputs which are needed to select a given frequency. This device can be any of a wide variety of available devices including binary switches, toggle switches, an encoder or microprocessor, etc.

The address latches 80 will load the address data only when a positive pulse occurs on the clock input 82. The clock input 82 is coupled directly to the output terminal 36 of the loop divider. Therefore, the address latches will load new data into the latches only when a loop divider pulse (see waveform L, FIG. 6) occurs. This prevents the data in the address latches from changing except when the loop pulse occurs. The data stored in the address latches is applied to the address inputs $A_3$–$A_7$ of the PROM 70. In the preferred system, these address inputs are the five most significant bits of the PROM address. The PROM 70 is arranged so that the five most significant bits address a segment of the PROM which contains the six sets of data to be loaded into the frequency programming data latches for the frequency selected. The three least significant bits $A_0$–$A_2$ are applied to the PROM from the multiplexer. Therefore, the six PROM memory locations will be addressed sequentially as a result of the six address states of Table 1 being applied sequentially to the inputs $A_0$–$A_2$ of the PROM 70. Each location in the PROM will contain four data bits which are applied to the outputs 71–74 of the PROM 70 when the address of that location exists on the PROM 70 address inputs $A_0$–$A_7$.

It should be recalled that at the same time that the address inputs $A_0$–$A_2$ are being sequentially incremented (see waveforms C, D and E of FIG. 6), the strobe lines $S_1$-$S_6$ of the multiplexer 50 are being sequentially strobed (see waveforms F-K, FIG. 6). As a result, the multiplexer strobes each set of four latches in the frequency data latch 60 at the same time as it addresses a set of four bits in the PROM which are directly applied to the data input $D_0$-$D_3$. Accordingly, the data $D_0$-$D_3$ is loaded into the appropriate data latch. Once a complete cycle has occurred (i.e., after the strobe pulse $S_6$ has occurred), the decoder will be disabled until the reference signal again goes low on the $\overline{ENABLE}$ input 54. The overall result is that new data is multiplexed into the frequency programming data latches 60 only during the time that the reference signal is low.

Another method of improving the performance of frequency synthesizers involves the use of a multiple range voltage controlled oscillator. This permits the frequency synthesizer to operate over a wider range of frequencies by breaking the voltage controlled oscillator tuning range down into smaller frequency ranges, thereby allowing a smaller voltage controlled oscillator gain constant to be used to cover an equivalent range of frequencies. However, to obtain the full advantages of the optimum gain sample-and-hold frequency synthesizer, it is necessary to synchronize the shifting of the range of the voltage controlled oscillator so that the range shifts at the beginning of the first count cycle using the new divisor. This is because the described fast lock technique requires that the loop cycle be completed using the old N with the old frequency from the voltage controlled oscillator before the range is shifted.

The range shift synchronization is accomplished as shown in FIG. 2 by the use of the range shift latches 92. In the preferred embodiment two bits of the data stored in the frequency programming data latches 60 are the data which determine the range of operation for the voltage controlled oscillator at the programmed frequency. Thus, the range shift bits $R_1$ and $R_2$ are coupled from the frequency programming data latches 60 to the inputs 94, 95 of the range shift latches 92. The clock input 93 of the range shift latches 92 is coupled directly to the output terminal 36 of the loop divider 34. The range shift latches 92 are positive edge triggered. Therefore, after the frequency programming data has been strobed into the data latches and applied to the loop divider 34, the loop divider 34 will finish dividing the existing signal at the old divisor and will produce a loop divider pulse at the end of the count cycle. This loop divider pulse will then trigger the range shift latches 92 causing the data applied to the inputs 94 and 95 to be loaded into the range shift latches 92. An example of the signal on the output of one of the latches 92 when the data is changed from a low to a high is shown as waveform M of FIG. 6. When the new data has been loaded into the range shift latches 92, the data is applied directly to the range shift inputs 25 and 27 of the voltage controlled oscillator 30 thereby changing the range of the voltage controlled oscillator. Thus, the range of the voltage controlled oscillator is changed only at the beginning of the first count at the new divisor.

Figure 3:
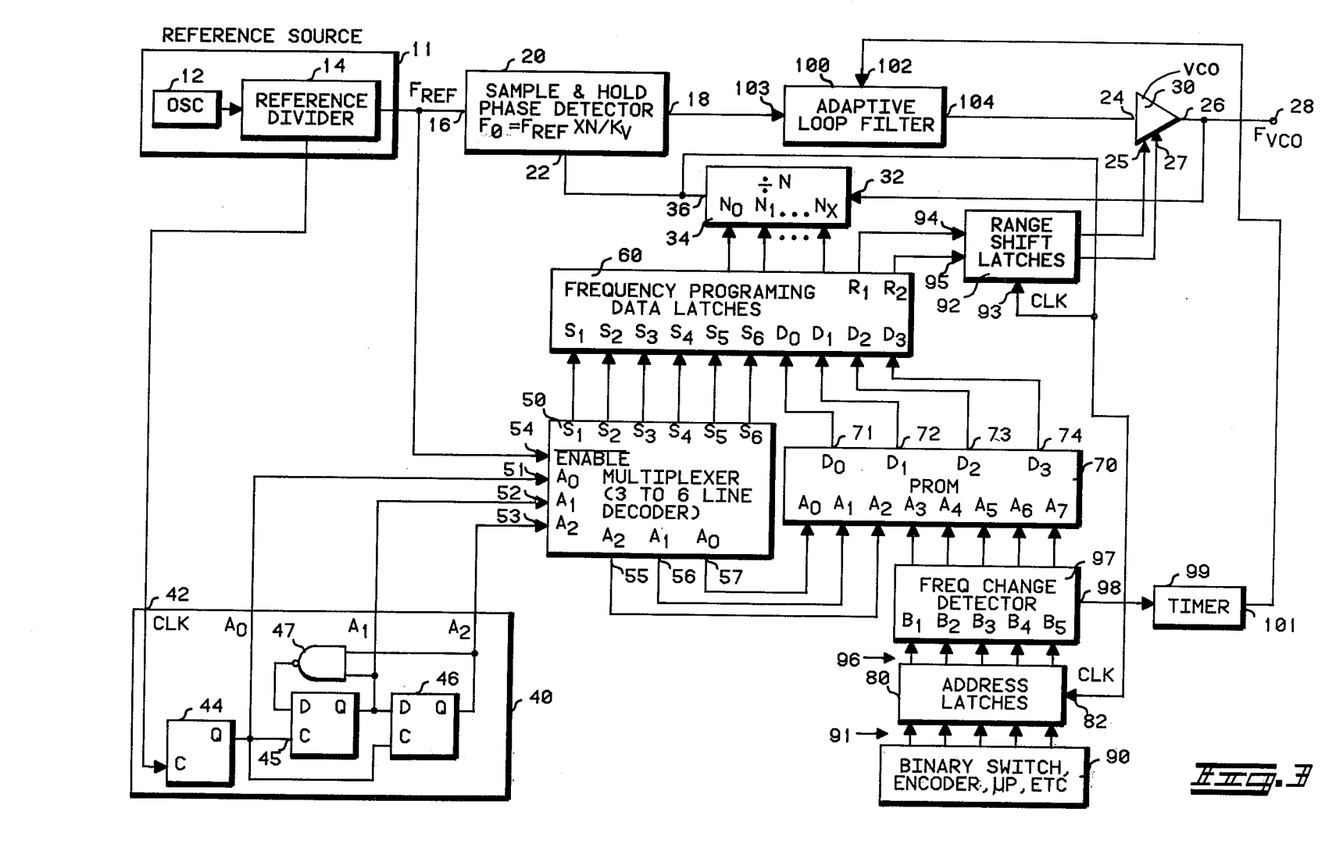
FIG. 3 is a block diagram illustrating still another embodiment of the novel fast lock frequency synthesizer utilizing an adaptive loop filter.

In order to improve noise performance in frequency synthesizers, it is common to place a low pass filter between the phase comparator and the voltage controlled oscillator. In the novel fast lock system described, however, this would cause the frequency synthesizer to take substantially greater time to lock to a new frequency. However, in order to obtain the advantages of improved noise performance and still maintain the fast lock characteristic of the novel frequency synthesizer, in adaptive loop filter is employed as shown in FIG. 3. This type of filter allows the loop filter to be bypassed for large frequency changes but places the filter in the loop when frequency lock is obtained. Thus, the fast lock technique can be used in a high performance digital frequency synthesizer with low noise and feedthru characteristics.

Referring now to FIG. 3, the frequency selection data from frequency selection device 90 on the five data lines 91 is applied to the address latches 80. The frequency data is then coupled directly to the inputs $B_1$-$B_5$ of a frequency change detector 97 via the five data lines 96 from the address latches 80. The frequency change detector 97 generates a pulse on its output 98 whenever the data on any of the five data lines 96 changes. The signal on the frequency change detector output terminal 98 is applied directly to a timer 99. The timer 99 generates a pulse of predetermined period on its output terminal 101 in response to the pulse from the frequency change detector output terminal 98. The timer pulse is selected to be long enough to permit the loop to acquire a new frequency before the loop filter is switched into the synthesizer loop and to permit the charging of the appropriate loop filter capacitors.

The timing pulse on the output 101 is applied directly to the control input terminal 102 of an adaptive loop filter 100 (shown in greater detail in FIG. 5). The adaptive loop filter has an input terminal 103 coupled directly to the output terminal 18 of the phase comparator 20 and has an output terminal 104 coupled directly to the input terminal 24 of the voltage controlled oscillator 30. When the timer signal on the control input terminal 102 of the adaptive loop filter 100 is high, the filter connects the input terminal 103 directly to the output terminal 104 thereby connecting the phase comparator 20 directly to the voltage controlled oscillator 30. This allows the fast lock technique as previously described to be fully utilized and yields a first order loop transfer function. After a time period determined by the timer 99 the timing signal on the control input terminal 102 goes low and the adaptive loop filter switches a low pass filter between the input terminal 103 and the output terminal 104. Thus the control signal from the phase comparator 20 is filtered and filtered signal is applied to the voltage controlled oscillator 30. The phase locked loop will then yield the desired second or third order transfer function for optimum closed loop performance. This permits the frequency synthesizer to lock to a new frequency when there is a frequency change using the fact lock first order loop, and permits the loop filter to be placed in the loop after lock has been acquired, thus providing improved noise and feedthru performance.

The frequency change detector 97 is shown in greater detail in FIG. 4. As shown in FIG. 4, a set of five inputs $B_1$-$B_5$ are respectively coupled directly to one input of a set of five exclusive OR gates G1-G5. In addition, the inputs $B_1$-$B_5$ are coupled respectively to the D input of a set of D latches L1-L5. The Q output of each D latch L1-L5 is coupled respectively to the second input of the exclusive OR gates G1-G5. The output of the five exclusive OR gates G1-G5 are coupled to the inputs of a five input OR gate G6. The output of the OR gate G6 is coupled directly to a monostable multivibrator 105 whose output is coupled to the output terminal 98. The output of the monostable multivibrator 105 is also coupled to the C (clock) input of each of the D latches L1–L5 as shown.

In the steady state condition the D input and the Q output of each D latch L1–L5 is at the same logic level and therefore the output of each exclusive OR gate G1–G5 is at the logic 0 level since both inputs of each gate are equal. Since all inputs to the OR gate G6 are zeros, its output is also at the zero level, and the monostable, multivibrator 105 is untriggered and in the zero output state. If one or more of the input data bits $B_1$–$B_5$ changes state, the input D and the output Q of the D latch associated with each changed bit will be in opposite states and the exclusive OR gate of each changed bit will change to the one state. This will cause the output of the OR gate G6 to change to the one state thereby triggering the monostable multivibrator 105. Since the monostable multivibrator 105 is connected to the C inputs of the D latches L1–L5, the new data on the $B_1$–$B_5$ inputs will now clock through the latches L1–L5 causing all the exclusive OR gates G1–G5 and the OR gate G6 to revert to the zero state. When the pulse from the monostable multivibrator 105 times out, the circuit is again in its original state awaiting another data change. Therefore, it can be seen that the frequency change detector shown in FIG. 4 will generate a pulse on the output terminal 98 whenever the data on the inputs $B_1$–$B_5$ changes.

FIG. 5 illustrates a more detailed circuit diagram of the adaptive filter 100 shown in FIG. 3. Switch 1 and switch 2 shown in FIG. 5 can be any low input-output offset voltage analog switch. In the preferred embodiment, these switches are CMOS transmission gates. When a high signal is applied to the switch control input 102, switch 1 and switch 2 are closed and the loop is in a wide bandwidth mode. In this mode, the filter composed of the resistors R1, R2 and R3, and capacitors C1 and C2, is shorted, and the input 103 is directly connected through closed switch 1 to the output 104. Also, in this mode, when switch 1 and switch 2 are closed, the capacitor C1 is quickly charged by the signal on the input 103 through the closed switch 2 and the capacitor C2 is quickly charged through the closed switch 1. This shortens the charging time by a significant amount and allows the loop to reach its new frequency quickly with the first order closed loop response previously described with reference to FIG. 2. When switch 1 and switch 2 are opened, by the signal on control input 102 going low, the full loop filter attenuation is in place to obtain the desired noise and reference feedthru rejection. The loop filter can be designed to yield the desired second or third order closed loop response. The time period during which the control voltage on input 102 remains high, keeping switch 1 and switch 2 closed should be sufficient for the first order loop to acquire the voltage that corresponds to the new frequency and to permit the capacitors C1 and C2 to charge.

It can be seen that a fast lock frequency synthesizer is provided which is capable of locking to a new frequency very rapidly. In addition, the high speed characteristics of this loop can be fully utilized when using a multiple counter loop divider, a multiple frequency range voltage controlled oscillator and an adaptive loop filter, by means of proper synchronization.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed and claimed herein.

What is claimed is:

1. An improved fast-lock frequency synthesizer comprising:
    a. a reference signal source for generating a reference signal of frequency $F_{REF}$;
    b. a voltage controlled oscillator, for producing an oscillator signal at its output in response to a control signal applied to its input and having a gain $K_V$;
    c. programmable divider means for frequency dividing the controlled oscillator signal by a divisor N;
    d. a sample-and-hold phase comparator means, having a first input coupled to the reference signal source, a second input coupled to the divider means, and an output coupled to the voltage controlled oscillator, for producing the control signal at its output, representative of the phase difference of the signals received at the first and second input, said phase comparator having a gain $K_\phi$ approximately given by the expression $K_{100} = N \times F_{REF}/K_V$, where $K_\phi$ is expressed in volts/radian, $F_{REF}$ is expressed in hertz, and $K_V$ is expressed in radians/volt-sec.

2. The improved fast-lock frequency synthesizer of claim 1 further comprising means for synchronously programming the divider means from an old divisor to a new divisor by loading the new divisor so that the divider means does not begin counting by the new divisor before the divider means completes a count by the old divisor.

3. The improved fast-lock frequency synthesizer of claim 2 wherein the voltage controlled oscillator operates over a plurality of frequency ranges, further comprising means for synchronously shifting the frequency range of the voltage controlled oscillator by range shifting in response to the divider means having completed the count utilizing the old divisor.

4. The improved fast-lock frequency synthesizer of claims 1, 2 or 3 further comprising:
    signal processing means including filtering means, and having an input coupled to the output of the phase comparator means and an output coupled to the voltage controlled oscillator input, said signal processing means for connecting, for a period of time required to permit the frequency synthesizer to acquire the desired frequency, the input directly to the output in response to a change in the loop divisor and for coupling at all other times, the input to the filtering means for filtering the control signal and applying the filtered control signal to the output.

* * * * *

UNITED STATES PATENT AND TRADEMARK OFFICE
CERTIFICATE OF CORRECTION

PATENT NO. : 4,330,758
DATED : May 18, 1982
INVENTOR(S) : SWISHER, et al.

It is certified that error appears in the above—identified patent and that said Letters Patent is hereby corrected as shown below:

In Column 2, lines 28, 29 and 32;

Column 4, lines 21, 24 and 26; and

Column 10, line 30, delete each occurrence of "$K_{100}$" and insert --$K_\phi$--.

Signed and Sealed this

Twenty-fifth Day of September 1984

[SEAL]

Attest:

Attesting Officer

GERALD J. MOSSINGHOFF

Commissioner of Patents and Trademarks